(12) United States Patent
Hatanaka et al.

(10) Patent No.: US 7,101,205 B2
(45) Date of Patent: Sep. 5, 2006

(54) ELECTRONIC APPARATUS

(75) Inventors: Kiyoyuki Hatanaka, Kawasaki (JP); Satoshi Watanabe, Kawasaki (JP); Shigeo Iriguchi, Kawasaki (JP); Nobuo Taketomi, Kawasaki (JP); Yoshitaka Muraoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/033,256

(22) Filed: Jan. 12, 2005

(65) Prior Publication Data
US 2006/0073711 A1 Apr. 6, 2006

(30) Foreign Application Priority Data
Oct. 1, 2004 (JP) .............................. 2004-289711

(51) Int. Cl.
*H01R 3/00* (2006.01)
(52) U.S. Cl. ..................................... 439/165
(58) Field of Classification Search ................ 439/165, 439/13, 164, 162; 361/755, 752, 797
See application file for complete search history.

(56) References Cited
U.S. PATENT DOCUMENTS
6,650,547 B1 * 11/2003 Hemmi et al. .............. 361/755
6,728,557 B1 * 4/2004 Tracy et al. ............. 455/575.3
6,976,861 B1 * 12/2005 McWilliam et al. ........ 439/165
6,979,214 B1 * 12/2005 Liou ........................... 439/165
2003/0211873 A1 11/2003 Komiyama

FOREIGN PATENT DOCUMENTS

| JP | 62-199057 | * 2/1987 |
| --- | --- | --- |
| JP | 6-295212 | 10/1994 |
| JP | 8-137577 | 5/1996 |
| JP | 2002-300247 | 10/2002 |
| JP | 2004-47968 | 2/2004 |

* cited by examiner

*Primary Examiner*—Tulsidas C. Patel
*Assistant Examiner*—Phuongchi Nguyen
(74) *Attorney, Agent, or Firm*—Staas & Halsey LLP

(57) ABSTRACT

A flexible printed circuit board that electrically connects a main body and a rotary body to each other is twisted in advance through an angle that is a half of an angle of rotation through which the rotary body is rotated. One end of the flexible printed circuit board is fixed to the main body, and the other end thereof is fixed to the rotary body. The rotary body is rotated in a direction causing the twist of the flexible printed circuit board to diminish.

16 Claims, 4 Drawing Sheets

ELECTRONIC APPARATUS

BACKGROUND OF THE INVENTION

1. Field of the Invention

The present invention relates to electronic apparatus including a rotary unit that is rotated horizontally relative to a main unit.

2. Description of the Related Art

A compact electronic apparatus, for example, a portable cellular phone or a personal digital assistant is generally of a fold-down type and comprises a movable unit serving as a display unit that has a liquid crystal display screen and a main unit serving as a keyboard unit to input numbers and characters. In recent years, a portable cellular phone having a display unit that can be rotated 180° horizontally to a keyboard unit has made its debut. With the display unit closed, the keyboard unit is located under the display unit. When the portable cellular phone is opened, the display unit and keyboard unit are disjoined from each other at an angle of 180°. Unlike the fold-down type, the rotary type has the display unit thereof oriented forward. If the keyboard is not required to enter a phone number, telephoning or e-mail can be performed with the portable cellular phone left closed. Moreover, if the portable cellular phone includes a camera facility, the large display unit serves as a viewfinder. Moreover, if the portable cellular phone includes a facility for receiving television, viewing and listening can be achieved with the display unit left closed. The rotary type portable cellular phone is therefore expected to be widely adopted in the future.

The display unit of the portable cellular phone and the keyboard unit thereof are electrically connected to each other with a hinge between them. The fold-down type portable cellular phone adopts a flexible printed circuit (FPC) board having numerous signal lines printed on a flexible insulating plate (refer to Japanese Unexamined Patent Application Publication No. 2004-47968). However, the rotary type portable cellular phone whose display unit is rotated has signal lines, which pass through a shaft support via which the display unit is pivoted, twisted 180°. If the flexible printed circuit board is twisted through an angle exceeding 90°, a load on the flexible printed circuit board increases. This brings about the risk of breakage. Therefore, the flexible printed circuit board cannot be disposed in a place where the flexible printed circuit board may be twisted 180°. Consequently, there is difficulty in disposing the flexible printed circuit board in the shaft support for the purpose of electrically connecting the display unit and keyboard unit. Therefore, signal lines formed with thin cables are bundled and passed through the hinge in order to electrically connect the display unit and keyboard unit.

SUMMARY OF THE INVENTION

However, when thin cables are employed, numerous signal lines must be bundled. In order to run them through a shaft support, a wider space is required in the direction of the thickness of a portable cellular phone than it is when a flexible printed circuit board is adopted. This discourages attempts to realize a thin portable cellular phone. Accordingly, an object of the present invention is to provide electronic apparatus having a rotary unit and a main unit thereof joined with a flexible printed circuit board.

According to the present invention, there is provided electronic apparatus comprising a main unit, a rotary unit pivoted to the main unit via a shaft support and rotated through a predetermined angle of rotation, and a flexible printed circuit board passing through the shaft support. The flexible printed circuit board is twisted through an angle equivalent to a half of the predetermined angle of rotation of the rotary unit, and fixed to each of the main unit and rotary unit. The rotary unit is rotated in a direction causing the twist of the flexible printed circuit board to diminish.

The predetermined angle of rotation of the rotary unit may be set to 180° or less. One end of the flexible printed circuit board and the other end thereof may be oriented in the same direction and coupled to the main unit and rotary unit respectively.

Furthermore, the flexible printed circuit board may have a bellows-like portion, that is, have a portion thereof folded like bellows, and the bellows-like portion may be twisted.

According to the present invention, the flexible printed circuit board will not be twisted through an angle equal to or greater than a half of the angle of rotation. A load on the flexible printed circuit board can be reduced. Moreover, the flexible printed circuit board has the bellows-like portion. When the bellows-like portion is twisted, the load is further dispersed.

DESCRIPTION OF THE PREFERRED EMBODIMENTS

Figure 1A:
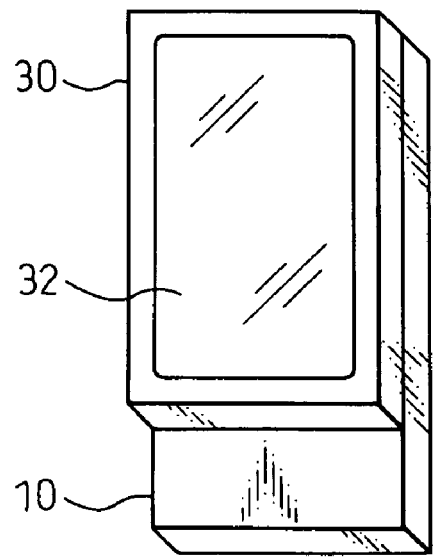
FIG. 1A shows the appearance of a rotary type portable cellular phone which is closed and to which one embodiment of the present invention is applied.

Referring to the drawings, embodiments of the present invention will be described below.

Figure 1B:
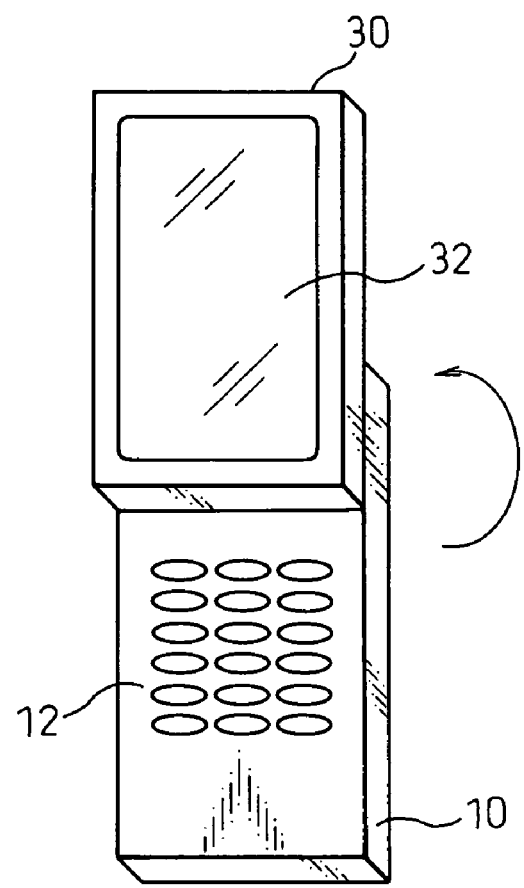
FIG. 1B shows the appearance of the rotary type portable cellular phone that is left open.

FIGS. 1A and 1B show the appearance of a rotary type portable cellular phone to which an embodiment of the present invention is adapted. The rotary type portable cellular phone comprises a main body 10 having a keyboard unit 12, and a rotary body 30 including a display unit 32 that has a liquid crystal display screen. The rotary body 30 is pivoted to the main body and rotatable horizontally with respect to the main body. FIG. 1A shows the rotary type portable cellular phone with the rotary body 30 closed, and FIG. 1B shows it with the rotary body 30 horizontally 180° rotated and thus left open. In either of the states, the display unit 32 is located on the front of the cellular phone. In the open state shown in FIG. 1B, the keyboard unit 32 appears and enables entry of numerals or characters. The lower part of the surface of the main body is available even when the rotary body 30 closed. Various operation switches enabling manipulations other than those to be performed using a numeric keypad are arranged in the lower part of the surface of the main body so that telephoning or receiving an e-mail message can be performed with the rotary body closed. Moreover, a telephone number can be read from a built-in memory in order to make a telephone call. Incidentally, the rotary type portable cellular phone itself is already known, and the main body and rotary body may be designed to have substantially identical sizes.

For a better understanding of the operation and advantage of the present invention, a conventional rotary type portable cellular phone having a main body 10 and a rotary body 30 electrically connected to each other using thin cables will be described in conjunction with FIG. 6A to FIG. 7B.

Figure 6A:
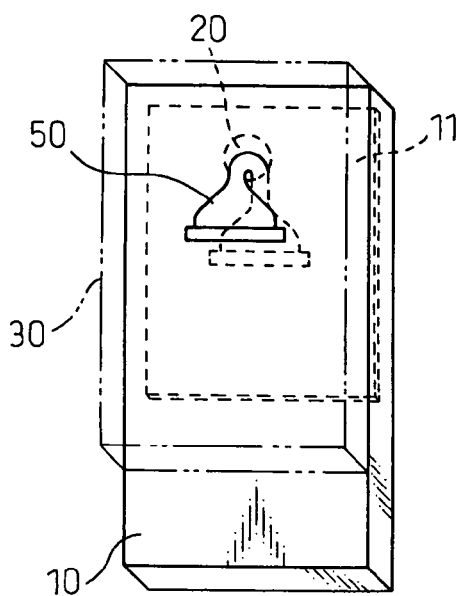
FIG. 6A is a partially perspective view showing a conventional rotary type portable cellular phone that is closed and employs thin cables.
Figure 6B:
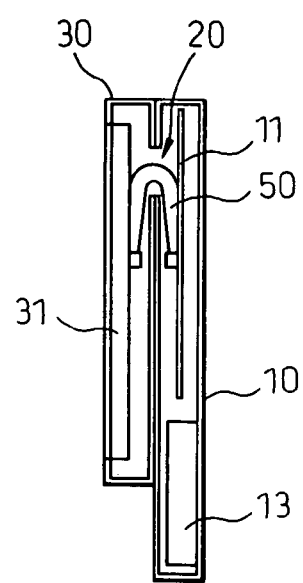
FIG. 6B is a schematic sectional view of the rotary type portable cellular phone shown in FIG. 6A.

FIG. 6A is a schematic view perspectively showing a joint between a main body 10 of a conventional portable cellular phone that is closed and a rotary body 30 thereof for a better understanding of the electrical connection between the main body 10 and rotary body 30. FIG. 6B is a schematic sectional view showing a longitudinal section of the portable cellular phone on which an opening 20 shown in FIG. 6A is contained. A bundle of thin cables 50 having one end thereof coupled to a main body substrate 11 incorporated in the main body 10 is passed through the opening 20 bored in a shaft support via which the rotary body 30 is pivoted. The bundle of thin cables 50 is then coupled to a rotary body substrate 31 incorporated in the rotary body 30. Incidentally, general electronic components 13 include electronic circuits and a battery incorporated in the portable cellular phone.

Figure 7A:
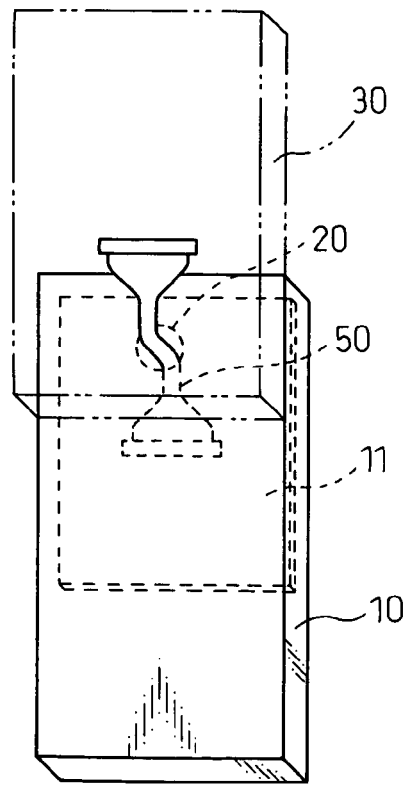
FIG. 7A is a partially perspective view showing a conventional rotary type portable cellular phone that is left open and employs thin cables.
Figure 7B:
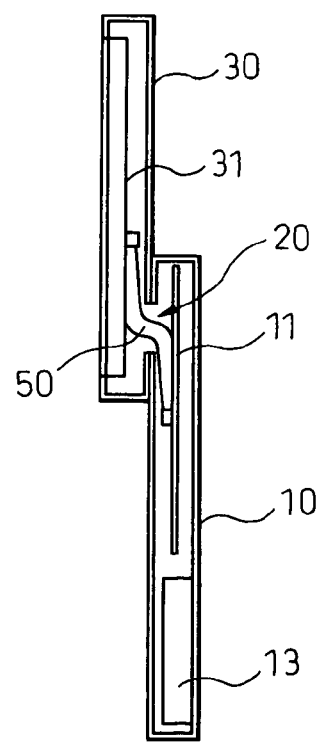
FIG. 7B is a schematic sectional view of the rotary type portable cellular phone shown in FIG. 7A.

FIG. 7A is a schematic view perspectively showing a joint between the main body 10 of the portable cellular phone that is left open and the rotary body 30 thereof for a better understanding of the electrical connection between the main body 10 and rotary body 30. FIG. 7B is a schematic sectional view showing a longitudinal section containing the opening 20 shown in FIG. 7A. FIG. 7A shows the portable cellular phone with the rotary body, which is closed in FIG. 6A, rotated 180° and thus left open. As seen from the drawings, conventionally, the main body 10 and rotary body 30 are electrically connected to each other using the bundle of thin cables 50, and the rotary body can be rotated 180°. However, as is apparent from FIG. 6B and FIG. 7B, a space in which the bundle of thin cables 50 is stored must be created in the main body 10 and rotary body 30 alike. This discourages attempts to realize a more compact portable cellular phone with the heights of the main body 10 and rotary body 30 reduced.

As mentioned above, the present invention employs a flexible printed circuit board in efforts to realize a more compact portable cellular phone.

Figure 2A:
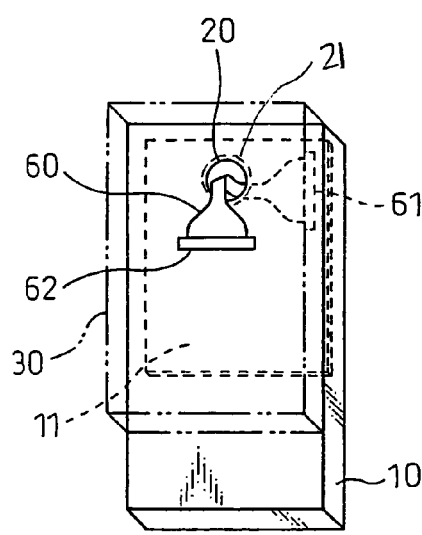
FIG. 2A schematically shows a portable cellular phone in accordance with one embodiment of the present invention which is closed.
Figure 2B:
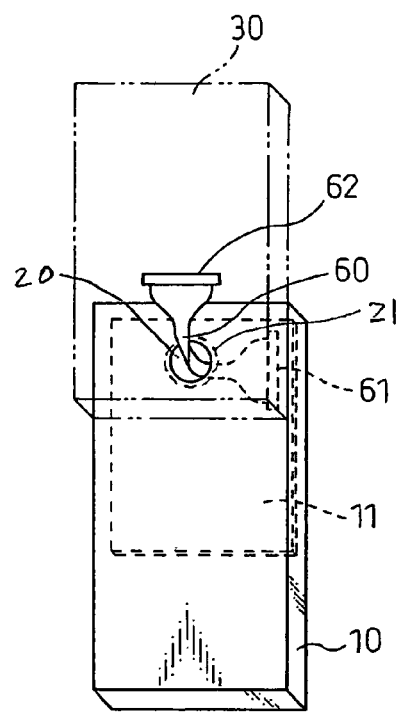
FIG. 2B schematically shows the portable cellular phone in accordance with the embodiment which is left open.

FIGS. 2A and 2B show the first embodiment of the present invention employing a flexible printed circuit board. FIG. 2A is equivalent to FIG. 1A and shows a portable cellular phone that is closed. FIG. 2B is equivalent to FIG. 1B and shows the portable cellular phone that is left open. The portable cellular phone is rotated 180° counterclockwise and thus changed from the closed state to the open state. The present embodiment employs a flexible printed circuit board 60 so as to electrically connect the main body 10 and rotary body 30 to each other. As shown in FIG. 2A, with the portable cellular phone closed, the flexible printed circuit board 60 is twisted 90° in an opening 20 bored in a shaft support 21 communicating with both the main body 10 and rotary body 30. One end 61 of the flexible printed circuit board 60 is fixed to a main body substrate 11, which is incorporated in the main body, using, for example, a connector. The other end 62 of the flexible printed circuit board 60 is fixed to a substrate (not shown) incorporated in the rotary body 30. In the shown example, the ends 61 and 62 of the flexible printed circuit board 60 are oriented in different directions at an angle of 90°.

When the rotary body is rotated 180° counterclockwise, a keyboard unit becomes available. At this time, as shown in FIG. 2B, one end of the flexible printed circuit board 60 fixed to the movable body 30 is shifted from the position shown in FIG. 2A to a position where the end reaches after rotated 180°. The flexible printed circuit board 60 is twisted 90° in a direction opposite to the direction in which it is originally twisted as shown in FIG. 2A. While the flexible printed circuit board 60 is changed from the state shown in FIG. 2A to the state shown in FIG. 2B, the flexible printed circuit board 60 that is twisted 90° is rotated in a direction causing the twist of the flexible printed circuit board to disappear. When the rotary body 30 meets the main body 10 at an angle of 90°, the flexible printed circuit board becomes untwisted. As the rotary body 30 is further rotated, the flexible printed circuit board gets twisted in an opposite direction. Even when the rotary body 30 is rotated 180° to enter the state shown in FIG. 2b, the flexible printed circuit board 60 is twisted only 90° in a direction opposite to the direction in which it is twisted as shown in FIG. 2A. In order to return the portable cellular phone from the open state to the closed state, the rotary body is rotated 180° clockwise.

As mentioned above, according to the present embodiment, the flexible printed circuit board 60 electrically connecting the main body 10 and rotary body 30 to each other is twisted in advance through an angle (90°) equivalent to a half of the angle of rotation (180°) through which the rotary body 30 can be rotated. The rotary body 30 is then rotated 180° in a direction causing the twist of the flexible printed circuit board 60 to disappear. Consequently, when the main body and rotary body are joined with the flexible printed circuit board 60, if the rotary body is rotated 180°, the flexible printed circuit board 60 is twisted 90° at most. There is no chance that the flexible printed circuit board 60 may be broken. Thus, the flexible printed circuit board can be used to realize a more compact rotary type portable cellular phone.

An angle of twist through which the flexible printed circuit board is rotated is a half of an angle of rotation through which the rotary body is rotated, and therefore depends on the angle of rotation of the rotary body. Consequently, if the rotary body is rotated 90° with respect to the main body, the flexible printed circuit board is twisted 45° comparative to the half of 90° before the rotary body is rotated. In this case, the flexible printed circuit board is rotated 90° in a direction causing the twist of the flexible printed circuit board to disappear. Consequently, the flexible printed circuit board is twisted 45° in a direction opposite to the direction in which it is originally twisted. Incidentally, if the flexible printed circuit board is twisted through an angle larger than 90°, the load on the flexible printed circuit board would increase as mentioned previously. However, the present invention may be adapted to a portable cellular phone whose rotary body is rotated through an angle exceeding 180°. In this case, the flexible printed circuit board may be twisted through an angle larger than 90°.

Moreover, if a direction in which the flexible printed circuit board is twisted is reversed, the rotary body 30 is rotated clockwise and thus changed from the closed state to the open state. For example, the end 61 of the flexible printed circuit board 60 coupled to the main body substrate 11 in FIG. 2A may be secured on the left-hand side of the other end 62 thereof coupled to the movable body. Thus, the flexible printed circuit board may be twisted 90° in a direction opposite to the direction in which it is shown to be twisted in FIG. 2A.

Furthermore, the flexible printed circuit board 60 is first folded to have a shape of letter U, and then is twisted 90°, so that the flexible printed circuit board 60 can join the main body 10 and rotary body 30. Alternatively, the flexible printed circuit board 60 may be folded to have a shape of letter S, and then is twisted 90°. Even in this case, the flexible printed circuit board 60 can be rotated 180° in a direction causing the twist to disappear.

Figure 3A:
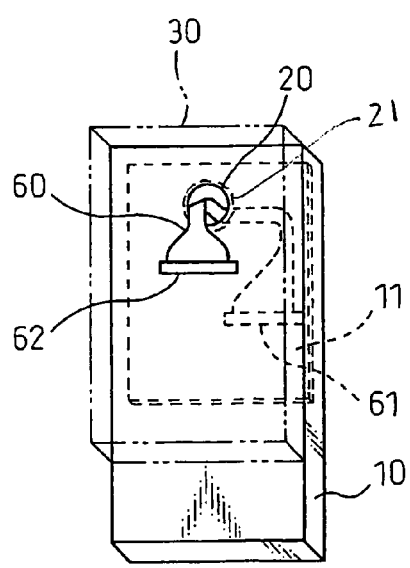
FIG. 3A schematically shows a portable cellular phone in accordance with another embodiment of the present invention which is closed.
Figure 3B:
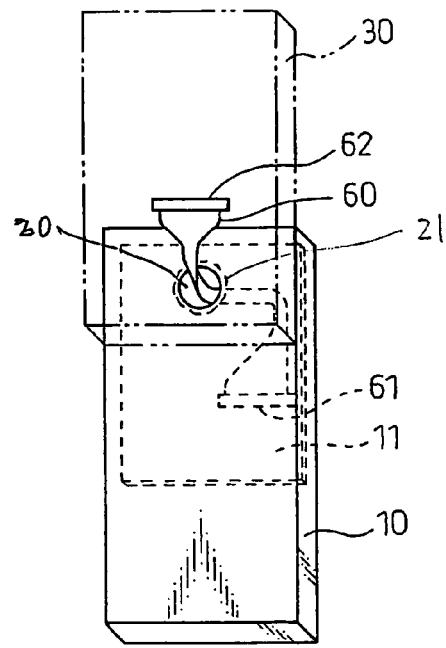
FIG. 3B schematically shows the portable cellular phone in accordance with the embodiment which is left open.

FIGS. 3A and 3B show the closed and open states of a second embodiment. According to the first embodiment, the ends 61 and 62 of the flexible printed circuit board 60 are disposed in different directions at an angle of 90° (FIG. 2A). As long as the flexible printed circuit board 60 is twisted 90° within the opening 20 bored in a shaft support 21, the positions the ends of the flexible printed circuit board 60 are located is a matter of layout. Referring to FIGS. 3A and 3B, the flexible printed circuit board 60 is twisted 90° within the opening 20 in the same manner as it is according to the first embodiment. However, the end 61 of the flexible printed circuit board 60 fixed to the main body is oriented in the same direction as the other end 62 thereof fixed to the rotary body 30. As seen from this example, the flexible printed circuit board 60 can be connected to a circuit located at any position in the main body and to a circuit located at any position in the rotary body.

Figure 4A:
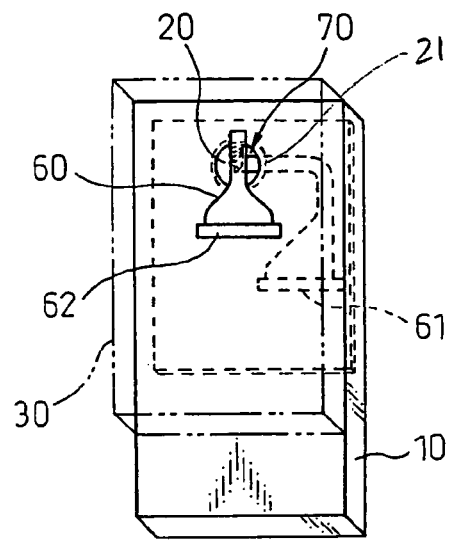
FIG. 4A schematically shows a portable cellular phone in accordance with still another embodiment of the present invention which is closed.
Figure 4B:
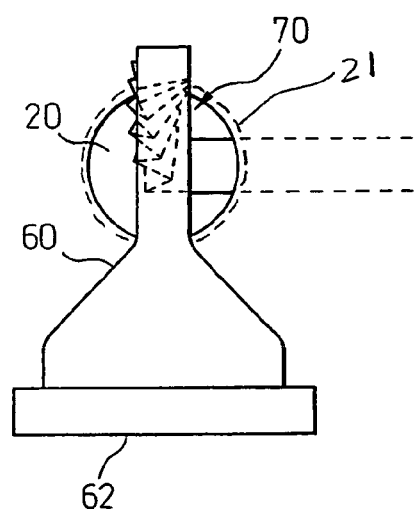
FIG. 4B is an enlarged view of part of the portable cellular phone shown in FIG. 4A.
Figure 5A:
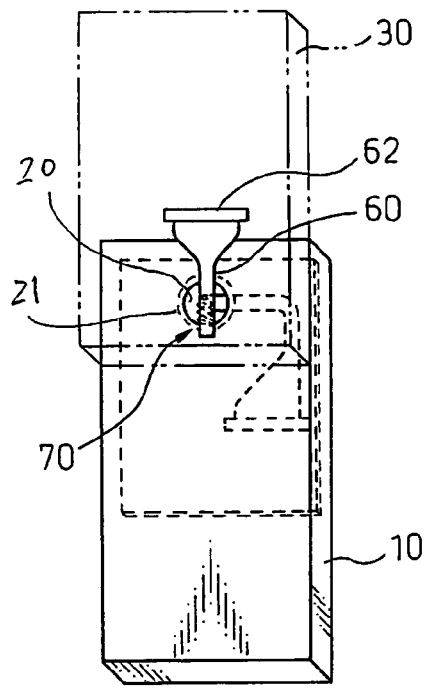
FIG. 5A schematically shows the portable cellular phone that shown in FIG. 4A and left open.
Figure 5B:
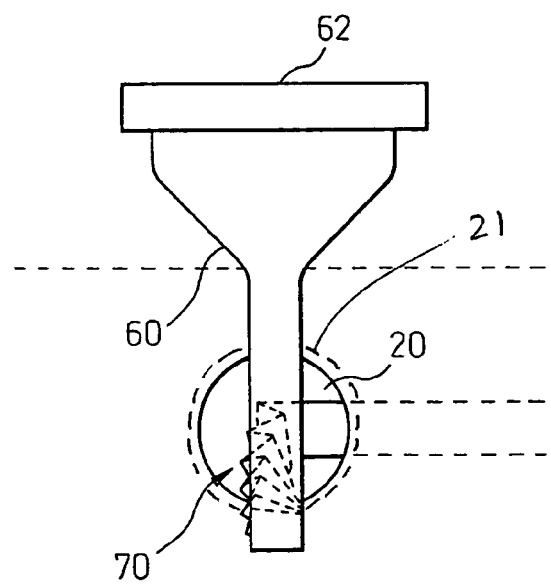
FIG. 5B is an enlarged view of part of the portable cellular phone shown in FIG. 5A.

FIG. 4A to FIG. 5B show a third embodiment. In the third embodiment, the flexible printed circuit board 60 has a bellows-like portion, that is, has a portion thereof folded like bellows in efforts to further diminish the load on a portion of the flexible printed circuit board 60 that is twisted. The bellows-like portion is twisted in order to further disperse the load on the twisted portion. FIG. 4A shows the closed state of the third embodiment. The portion of the flexible printed circuit board 60 included in the second embodiment as shown in FIG. 3A and is passed through the opening 20 is folded like bellows in order to produce the bellows-like portion 70. The bellows-like portion 70 is then twisted 90°. FIG. 4B is an enlarged view of part of the third embodiment. FIG. 5A shows the third embodiment that is left open, while FIG. 5B is an enlarged view of part of the third embodiment. In this case, the portion of the flexible printed circuit board 60 to be twisted is folded like bellows to produce the bellows-like portion 70. Consequently, the load on the flexible printed circuit board 60 is further dispersed, and the chance that the flexible printed circuit board 60 may be damaged or broken is further reduced.

The embodiments have been described on the assumption that the present invention is adapted to a portable cellular phone. The present invention is not limited to the portable cellular phone but may be adapted to a personal digital assistant or a portable television. Moreover, the present invention is not limited to the portable cellular phone whose rotary body is put on a main body thereof. The present invention can be adapted to an electronic apparatus whose rotary body is pivoted to the main body thereof.

What is claimed is:

1. An electronic apparatus, comprising:
   a main body;
   a rotary body horizontally pivoted to the main body via a shaft support and rotatable through a predetermined angle of rotation relatively to the main body; and
   a flexible printed circuit board passing through the shaft support and having opposite ends, wherein:
   the flexible printed circuit board is twisted in a first direction, in an intermediate portion thereof between the opposite ends, through an angle that is one half of the predetermined angle of rotation of the rotary body, and is fixed at the opposite ends thereof respectively to the main body and the rotary body; and
   the rotary body is rotatable in a second direction, opposite to the first direction causing the twist of the flexible printed circuit board in the first direction to diminish.

2. The electronic apparatus according to claim 1, wherein the opposite ends of the flexible printed circuit board are oriented in a common direction.

3. The electronic apparatus according to claim 1, wherein the intermediate portion of the flexible printed circuit board is folded like a bellows, and the bellows-like portion is twisted.

4. The electronic apparatus according to claim 1, wherein the intermediate portion of the flexible printed circuit board is folded like a letter U.

5. The electronic apparatus according to claim 1, wherein the intermediate portion of the flexible printed circuit board is folded like a letter S.

6. The electronic apparatus, as recited in claim 1, wherein the rotary body is rotatable in a second direction, opposite to the first direction, to eliminate the twist in the first rotatable direction and is further rotatable in the second direction through an angle that is one half the predetermined angle of rotation, producing a twist therein in the second direction.

7. The electronic apparatus according to claim 1, wherein the predetermined angle of rotation of the rotary body is 180° or less.

8. The electronic apparatus according to claim 7, wherein the predetermined angle of rotation of the rotary body is 180°.

9. An electronic apparatus, comprising:
   a main body having a first main planar surface and first and second opposite end surfaces;
   a rotary body having a first main planar surface and first and second opposite end surfaces, rotatably connected to the main body for rotation about an axis transverse to the respective first main planar surfaces of the main end rotary bodies, so as to maintain the respective first main surfaces thereof in parallel relationship, the rotary body being rotatable between a first position, in which the rotary body and the main body are in a first aligned relationship with the respective first and second opposite end surfaces thereof commonly disposed relative to the axis of rotation, to a second position in which the rotary body and main body are in a second aligned relationship in which the respective, first and second opposite end surfaces of the rotary body and main body are oppositely disposed, relative to the first relationship, and in which a portion of the rotary body extends beyond an end surface of the main body; and a flexible printed circuit board having opposite ends respectively connected to the main body and the rotary body and having an intermediate portion extending therebetween and twisted by rotation of the rotary body from an intermediate position, relatively to the main body, to the first aligned relationship and oppositely twisted when the rotary body is rotated from the intermediate position to the second aligned relationship.

10. The electronic apparatus according to claim 9, wherein the opposite ends of the flexible printed circuit board are oriented in a common direction.

11. The electronic apparatus according to claim 9, wherein the intermediate portion of the flexible printed circuit board is folded like a bellows, and the bellows-like portion is twisted.

12. The electronic apparatus according to claim 9, wherein the intermediate portion of the flexible printed circuit board is folded like a letter U.

13. The electronic apparatus according to claim 9, wherein the intermediate portion of the flexible printed circuit board is folded like a letter S.

14. The electronic apparatus, as recited in claim 9, wherein the rotary body is
    rotatable in the second direction to eliminate the twist in the first rotatable direction and is further rotatable in the second direction through an angle that is one half the predetermined angle of rotation, producing a twist in the second rotatable direction.

15. The electronic apparatus according to claim 9, wherein an angle of rotation of the rotary body between the first and second aligned relationships is 180° or less.

16. The electronic apparatus according to claim 15, wherein the angle of rotation of the rotary body between the first and second aligned relationships is 180°.

* * * * *